(12) United States Patent
Haager et al.

(10) Patent No.: US 6,716,035 B2
(45) Date of Patent: Apr. 6, 2004

(54) MATING ASSEMBLY FOR AN OEM DEVICE

(75) Inventors: James A. Haager, Phoenix, AZ (US); Kevin L. Kilzer, Chandler, AZ (US); Daniel P. Fogelson, Chandler, AZ (US); Ronald E. Tupa, Mesa, AZ (US)

(73) Assignee: Adtron Corporation, Phoenix, AZ (US)

( * ) Notice: Subject to any disclaimer, the term of this patent is extended or adjusted under 35 U.S.C. 154(b) by 0 days.

(21) Appl. No.: 10/260,915

(22) Filed: Sep. 30, 2002

(65) Prior Publication Data

US 2003/0228773 A1 Dec. 11, 2003

Related U.S. Application Data

(60) Provisional application No. 60/386,977, filed on Jun. 7, 2002.

(51) Int. Cl.⁷ .............................. H01R 12/00
(52) U.S. Cl. .................. 439/64; 439/362; 439/680; 439/928.1
(58) Field of Search .................. 434/64, 92, 362, 434/327, 680, 378, 928

(56) References Cited

U.S. PATENT DOCUMENTS

| | | | |
|---|---|---|---|
| 4,941,841 A | * | 7/1990 | Darden et al. ............... 361/685 |
| 5,492,481 A | * | 2/1996 | Lewis ........................ 439/159 |
| 6,414,928 B1 | | 7/2002 | Aoki et al. ................. 369/77.1 |
| 6,456,489 B1 | | 9/2002 | Davis et al. ................. 361/684 |
| 6,473,297 B1 | | 10/2002 | Behl et al. .................. 361/685 |

OTHER PUBLICATIONS

Directron.com, "Lian–Li—RH—321 Mobile Rack", copyright date of 1997–2002, 2 pages as published on Internet.
AMAMAX, "Removable IDE Hard Disk Drive Mobile Rack With Key Lock", 1 page as published on Internet.
Ram Electronics, "ATA66, ATA100 compatible removable hard drive mobile rack", 1 page as published on Internet.

* cited by examiner

*Primary Examiner*—Dean A. Reichard
*Assistant Examiner*—Jinhee Lee
(74) *Attorney, Agent, or Firm*—Cahill, von Hellens & Glazer P.L.C.

(57) ABSTRACT

A device to be detachably attached to a mechanical substructure includes rails on opposed sides joined at the front by a cross member. A pair of guides mounted on the substructure slidably receives and retains the rails upon attachment of the device. An alignment pin extending from a rail mates with a hole in one of the guides to insure alignment of an electrical connector of the device with an electrical connector mounted on the substructure. The cross member includes screws for securing the cross member to the substructure. A spring extending from a rail makes electrical contact with an adjacent guide and an electrostatic discharge contact plate to discharge any existing static charge.

12 Claims, 2 Drawing Sheets

MATING ASSEMBLY FOR AN OEM DEVICE

CROSS REFERENCE TO RELATED APPLICATIONS

The present application relates to subject matter disclosed in a provisional application entitled "Rail and Guide for a Device", assigned Ser. No. 60/386,977 and assigned a filing date of Jun. 7, 2002 and describing an invention made by the present inventors.

BACKGROUND OF THE INVENTION

1. Field of the Invention

The present invention relates to mating assemblies and, more particularly, to a guide assembly for mechanically supporting and electrically connecting a rail mounted device.

2. Description of the Related Prior Art

Various mechanical substructures, such as printed wiring boards and other mechanical devices provide support for detachably attached devices of various sorts that are electrically connected to elements attendant the mechanically substructure. No industry standard presently exists for mounting such devices on the mechanical substructure. Accordingly, provisions must be made unique to each device to mount same. Furthermore, the electrical interconnections vary widely in type and usually require manual engagement. The potential for substantial damage due to static electricity to components mounted on the mechanical substructure or components of a device being mounted exists. To dissipate any electrostatic charges, known procedures must be employed but the carrying out of such procedures is sometimes omitted with attendant actual or potential damage to one or more components.

SUMMARY OF THE INVENTION

The present invention relates to guides mounted upon a mechanical substructure for engaging the corresponding rails attached to a device to be demountably mounted upon the mechanical substructure. The alignment of the device with components of the mechanical substructure is assured through predetermined interconnection and alignment between the guides and the rails. Such alignment permits mating between electromechanical connectors attendant the device and the mechanical substructure. Elements interacting between the guides and the rails assure dissipation of any electrostatic charges and a zero static potential upon mounting of the device to preclude damage to the electrical components from static electricity. The cooperative engagement between the guides and the rails eliminates the need for manual access to make further mechanical or electrical connections and thereby permit a low profile mechanical packaging enclosure commensurate in size with the device.

It is therefore a primary object of the present invention is to provide a guide and rail assembly for mating and electrically connecting a device to a mechanical substructure.

Another object of the present invention is to provide an industry standard assembly for demountably mounting electromechanical devices on a mechanical substructure.

Still another object of the present invention is to provide a mating assembly which dissipates any existing electrostatic charges during the mating procedure.

Yet another object of the present invention is to provide a mating assembly which eliminates the need for manual mechanical connection and engagement of mating electrical conductors.

A further object of the present invention is to provide rails attachable to any device, or a housing therefor, for engagement with guides mounted on the mechanical substructure to which the device is to be mechanically and electrically connected.

A yet further object of the present invention is to provide a method for mating and electrically connecting a device in alignment with a mechanical substructure.

A still further object of the present invention is to provide a method for electrostatic dissipation upon mechanical and electrical attachment of a device to a substructure.

These and other objects of the present invention will become apparent to those skilled in the art as the description thereof proceeds.

DESCRIPTION OF THE DRAWINGS

The present invention will be described with reference to the following drawings, in which.

DESCRIPTION OF THE PREFERRED EMBODIMENT

Figure 1:
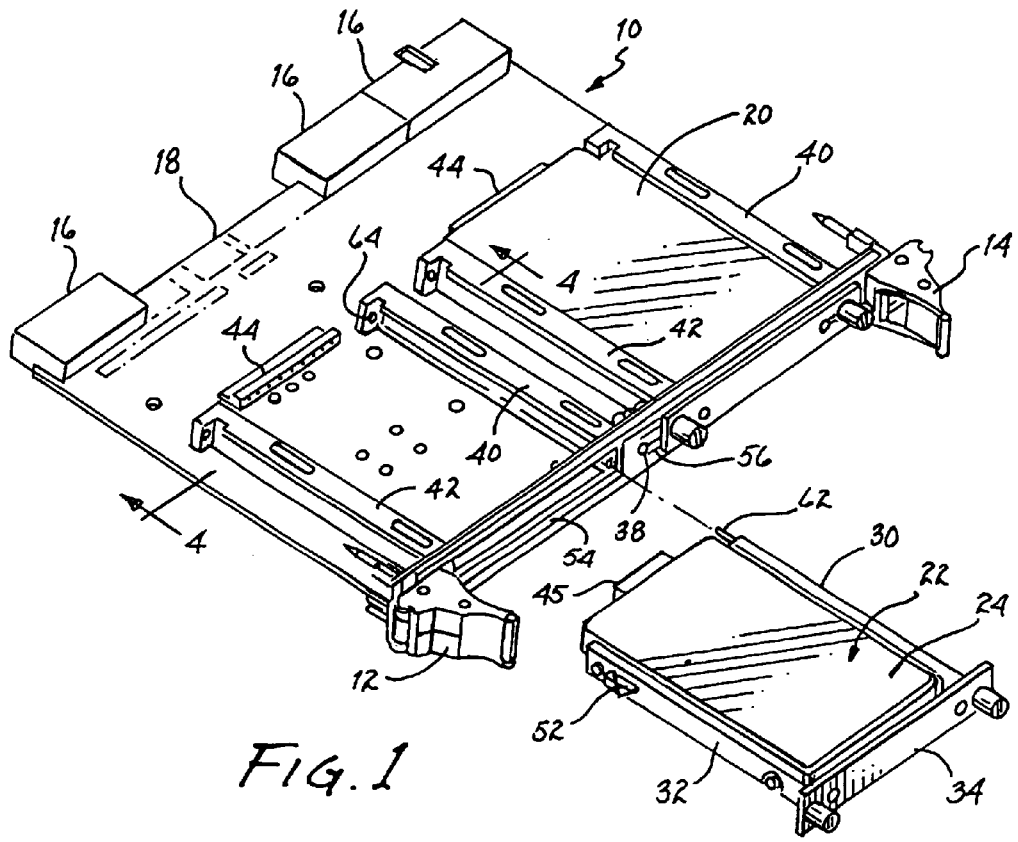
FIG. 1 is a perspective view of the present invention used in conjunction with a device to be attached to a mechanical substructure.

Referring to FIG. 1, there is shown a substructure 10 used as a mounting for various electrical, electromechanical and mechanical elements. The substructure may be removable from a chassis of signal processing equipment. Generally, substructure 10 and the elements forming a part thereof will constitute a component of a unit wherein signal processing is performed. Accordingly, substructure 10 may incorporate clasps 12 and 14 for detachably attaching the substructure to the unit. Moreover, the substructure may include various electromechanical connectors 16 disposed along rear edge 18 for electrically engaging other components of the signal processing equipment. Although not shown, various electrical components, such as integrated circuits transistors, resistors, capacitators, inductors, microprocessors, etc., may be mounted on the substructure.

Removably mounted electromechanical devices, such as media storage devices, hard disc drives, etc., may be mounted upon substructure 10 in conformance with the present invention. Device 20 is illustrated in FIG. 1 as being mechanically mounted upon the substructure and electrically connected thereto in conformance with the present invention. Device 22 is illustrated in FIG. 1 just prior to mounting same on substructure 10. A pair of rails 30, 32 are attached to each of devices 20, 22 or to a housing 24 for one of devices 20, 22. The rails are secured to opposed sides and include a cross member 34 containing securing means for securing the rail supported device to substructure 10. A pair of screws 36 penetrably engage cross member 34 for threaded engagement with apertured holes in faceplate 56, of which hole 38 is illustrated, to retain device 22 secured to substructure 10. A pair of guides 40, 42 are mounted upon substructure 10 to slidably receive rails 30, 32, respectively to accurately position the rail supported device upon the substructure. An electrical connector 44 is mounted on substructure 10 for mating with a corresponding electrical connector 45 disposed at the rear end of device 22.

Figure 2:
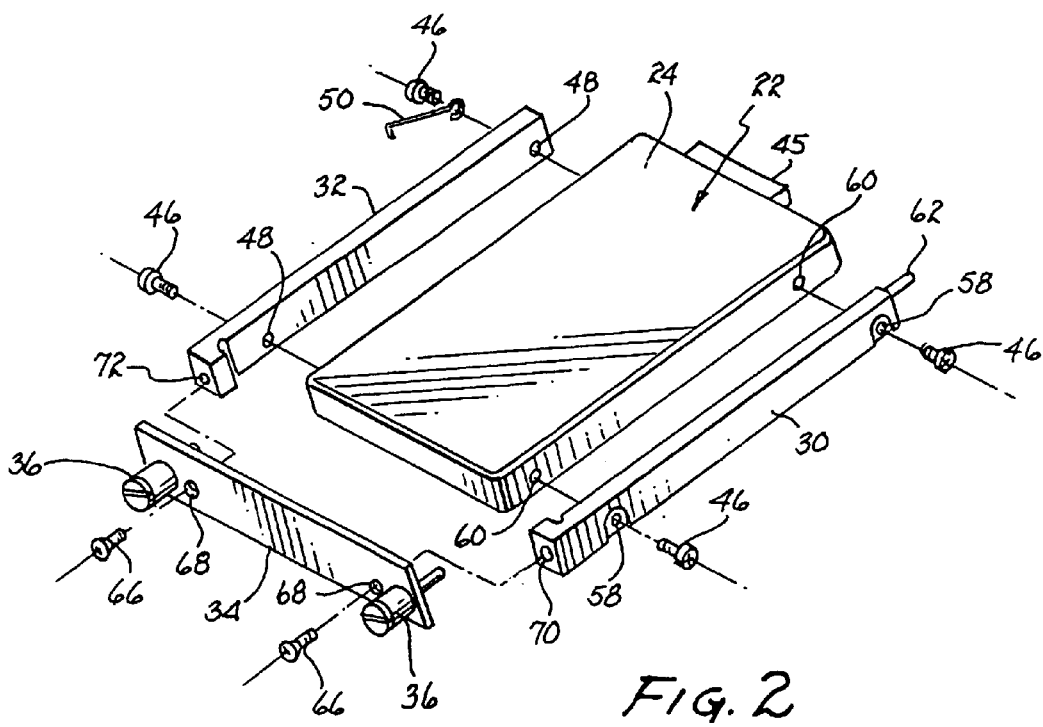
FIG. 2 is an exploded view of rails to be attached to a device.
Figure 3:
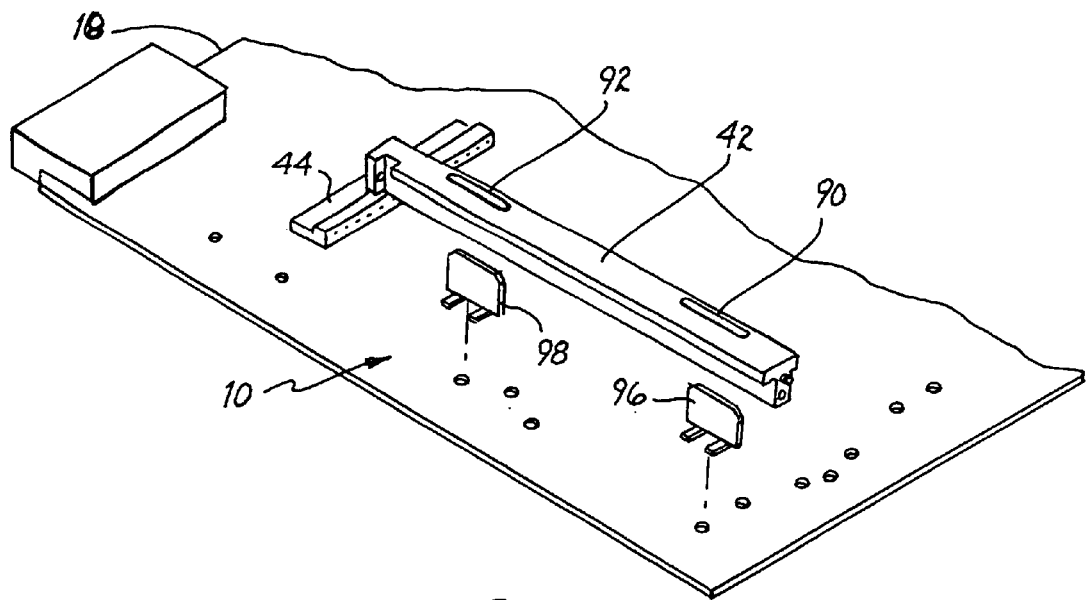
FIG. 3 is an exploded view of rails and electrostatic discharge contact plates supported on the substructure.
Figure 4:
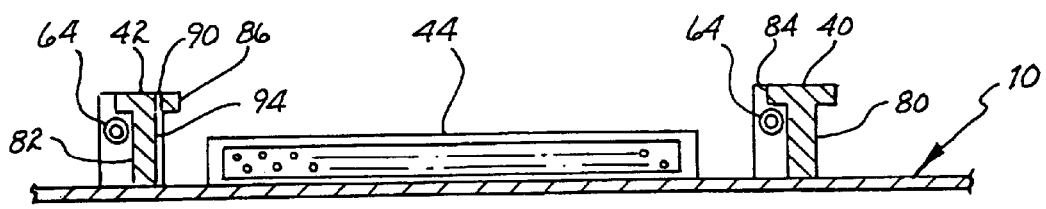
FIG. 4 is a cross-sectional view taken along lines 4—4, as shown in FIG. 1.

Referring jointly to FIGS. 2, 3 and 4, further details of rails 30, 32, cross member 34, and guides 40, 42 will be described. Rail 32 is secured to one side of device 22 by bolts or machine screws 46 penetrably engaging corresponding apertures 48 in the rail and threadedly engaging device 22 or a housing 24 of the device. To insure dissipation of any electrostatic charge attendant device 22, a spring 50 is retained by rear bolt 46 within a slot 52 formed in rail 32. The spring is bent outwardly to protrude beyond the surface of rail 32, as illustrated in FIG. 1, to insure engagement of the spring with plates 96, 98 (see FIG. 3) upon insertion of device 22 through aperture 54 in faceplate 56 attendant substructure 10. Thereby, as device 22 is slid through aperture 54 the spring makes an ongoing sliding electrical contact with plates 96, 98 to insure discharge of static electricity prior to engagement with electrical connector 44. Rail 30 is secured to the opposite side of device 22 or to housing 24 of the device by further bolts or machine screws 46 penetrably inserted through apertures 58 into threaded engagement with aperture 60. Rail 30 includes an alignment pin 62 for snug engagement with a receiving hole 64 disposed at the end of rail 40. Cross member 34 is secured to the ends of rails 30, 32 by bolts or machine screws 66 penetrably engaging respective apertures 68 and in threaded engagement with threaded holes 70, 72 at the ends of rails 30, 32, respectively.

Guides 40, 42 are essentially duplicates of one another and will be described with particular reference to FIGS. 3 and 4. These guides are attached to substructure 10 in a conventional manner parallel with one another and spaced apart a predetermined distance commensurate the spacing between rails 30, 32. Each guide is formed with a T-shaped cross section, as illustrated, whereby each upstanding leg 80 and 82 of guides rails 30 and 32 supports one of laterally extending overhangs 84 and 86 engaging the top surfaces of rails 30, 32 to prevent unwanted vertical movement. Upon insertion of device 22 (or housing 24), pin 62, extending from rail 30, engages aperture 64 of guide 40 to insure that electrical connector 45 at the rear of device 22 is in vertical and lateral alignment with electrical connector 44.

Each rail may include one or more slots 90, 92 coincident with recesses disposed in upstanding leg 82. Recess 94 aligned with slot 90 is illustrated in FIG. 4. A pair of electrostatic discharge contact plates 96, 98 are mechanically attached to substructure 10 and electrically grounded therewith. Each of these plates is lodged within a corresponding one of recesses 94. The primary purpose of plates 96, 98 is that of serving as an electrostatic discharge contacts and is engaged by spring 50 (see FIGS. 1 and 2) as device 22 is inserted through faceplate 56 of substructure 10.

It is intended that the guide and rail apparatus described above be in the nature of an industry standard to permit removable mounting of any of various devices upon a substructure. To meet this goal, each device 22 must be adapted for attachment of rails 30, 32 and include an electrical connector 45 commensurate with connector 44. Alternatively, a device to be mounted may be lodged within a casing or housing 24 configured for attachment of rails 30, 32, which housing would include a connector 45 commensurate with connector 44.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

We claim:

1. A mating assembly for detachably attaching a device to a mechanical substructure, said assembly comprising:
   a) a pair of rails disposed on and coupled with opposed sides of the device;
   b) a pair of spaced apart guides mounted upon the substructure for slidably engaging and mating with said pair of rails upon attachment of the device to the substructure;
   c) a spring extending from one rail of said pair of rails for electrically contacting a guide of said pair of guides to discharge any static charge present;
   d) at least one contact plate extending from the substructure for sliding engagement with said spring;
   e) a cross member interconnecting said pair of rails; and
   f) securing means for securing said cross member to the substructure.

2. A mating assembly as set forth in claim 1 including a first electrical connector attached to the device for engaging a second electrical connector mounted on the substructure upon attachment of the device to the substructure.

3. A mating assembly as set forth in claim 1 wherein each guide of said pair of guides are identical.

4. A mating assembly as set forth in claim 3 wherein each guide of said pair of guides includes an overhang adapted for slidable engagement with a respective rail of said pair of rails.

5. A mating assembly for detachably attaching a device to a mechanical substructure, said assembly comprising:
   a) a pair of rails disposed on and coupled with opposed sides of the device;
   b) a pair of spaced apart guides mounted upon the substructure for slidably engaging and mating with said pair of rails upon attachment of the device to the substructure;
   c) a cross member interconnecting said pair of rails;
   d) securing means for securing said cross member to the substructure;
   e) a first electrical connector attached to the device for engaging a second electrical connector mounted on the substructure upon attachment of the device to the substructure; and
   f) an alignment pin extending from a rail of said pair of rails for engaging a hole in a guide of said pair of guides to align said first and second electrical conductors with one another.

6. A mating assembly as set forth in claim 5 including a spring extending from another rail of said pair of rails for electrically contacting another guide of said pair of guides to discharge any static charge present.

7. A mating assembly as set forth in claim 6 including at least one contact plate extending from the substructure for sliding engagement with said spring.

8. A mating assembly as set forth in claim 5 wherein the device includes a housing adapted for coupling said pair of rails thereto.

9. A mating assembly as set forth in claim 5 wherein the substructure includes an apertured face plate for penetrably receiving the device.

10. A mating assembly as set forth in claim 9 wherein said securing means is adapted to secure said cross member to the face plate.

11. A mating assembly for detachably attaching a device to a mechanical substructure, said assembly comprising:
   a) a pair of rails disposed on and coupled with opposed sides of the device;

b) a pair of spaced apart guides mounted upon the substructure for slidably engaging and mating with said pair of rails upon attachment of the device to the substructure;

c) at least one contact plate extending from the substructure and at least one recess disposed in a guide of said pair of guides for receiving said at least one contact plate;

d) a cross member interconnecting said pair of rails; and e) securing means for securing said cross member to the substructure.

12. A mating assembly as set forth in claim 11 including a spring extending from one rail of said pair of rails for slidably engaging said contact plate to dissipate any electrostatic charge present upon attachment of the device to the substructure.

* * * * *